(12) United States Patent
Katsunuma

(10) Patent No.: US 7,189,653 B2
(45) Date of Patent: Mar. 13, 2007

(54) ETCHING METHOD AND ETCHING APPARATUS (75) Inventor: Takayuki Katsunuma, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 144 days.

(21) Appl. No.: 10/501,917

(22) PCT Filed: Feb. 3, 2003

(86) PCT No.: PCT/JP03/01052

§ 371 (c)(1),
(2), (4) Date: Jul. 27, 2004

(87) PCT Pub. No.: WO03/067643

PCT Pub. Date: Aug. 14, 2003

(65) Prior Publication Data
US 2005/0150863 A1    Jul. 14, 2005

(30) Foreign Application Priority Data
Feb. 7, 2002    (JP) ............................ 2002-030836

(51) Int. Cl.
*H01L 21/302* (2006.01)
(52) U.S. Cl. ................. 438/706; 438/711; 438/713; 438/728; 438/743
(58) Field of Classification Search ........... 438/711, 438/713, 728, 743
See application file for complete search history.

(56) References Cited

U.S. PATENT DOCUMENTS 6,159,862 A * 12/2000 Yamada et al. ............. 438/712
2001/0045667 A1    11/2001 Yamauchi et al.

FOREIGN PATENT DOCUMENTS

| JP | 10-150046 | 6/1998 |
|---|---|---|
| JP | 2000-307001 | 11/2000 |
| JP | 2001-127039 | 5/2001 |
| JP | 2001127039 A * | 5/2001 |
| WO | 99/33095 | 7/1999 |

* cited by examiner

Primary Examiner—Duy-Vu N. Deo
Assistant Examiner—Binh X. Tran
(74) Attorney, Agent, or Firm—Oblon, Spivak, McClelland, Maier & Neustadt, P.C.

(57) ABSTRACT

A mask material layer 102 of a desired pattern is formed on a silicon oxide film 101. The exposed parts of the silicon oxide film 101 is etched in accordance with the pattern of the mask material layer 102 by plasma etching by using a mixed gas fed at a rate such that the ratio ($C_5F_8+O_2/Ar$) of the total flow rate of $C_5F_8+O_2$ to the flow rate of Ar is 0.02 (2%) or less. Thus, a generally vertical right-angled portion is formed in the silicon oxide film 101. Therefore, no microtrenches are formed, and etching into a desired pattern is precisely effected.

15 Claims, 5 Drawing Sheets

ETCHING METHOD AND ETCHING APPARATUS

FIELD OF THE INVENTION

The present invention relates to an etching method and an etching apparatus used for manufacturing a semiconductor device having a fine circuit structure or other devices having a fine structure; and, more particularly, to an etching method and an etching apparatus for etching a silicon oxide according to a pattern of a mask material to form grooves having an approximately right-angled portion and the like.

BACKGROUND OF THE INVENTION

Conventionally, in the semiconductor device manufacturing field, for example, so-called dry etching for etching a desired portion by an effect of a plasma produced from a certain etching gas has been widely used to form a fine circuit structure of a semiconductor device.

Further, recently, also in other devices having a fine structure besides a semiconductor device, their fine structures are manufactured by performing dry etching for etching desired portions according to a pattern shape of a mask, instead of a mechanical cutting and the like.

With regard to such dry etching, when silicon oxide is plasma-etched, for example, a gaseous mixture of gas containing carbon and fluorine, oxygen gas and inert gas is used. More specifically, for example, a gaseous mixture which contains $C_5F_8$ gas, $O_2$ gas and Ar gas is used.

Figure 6A:
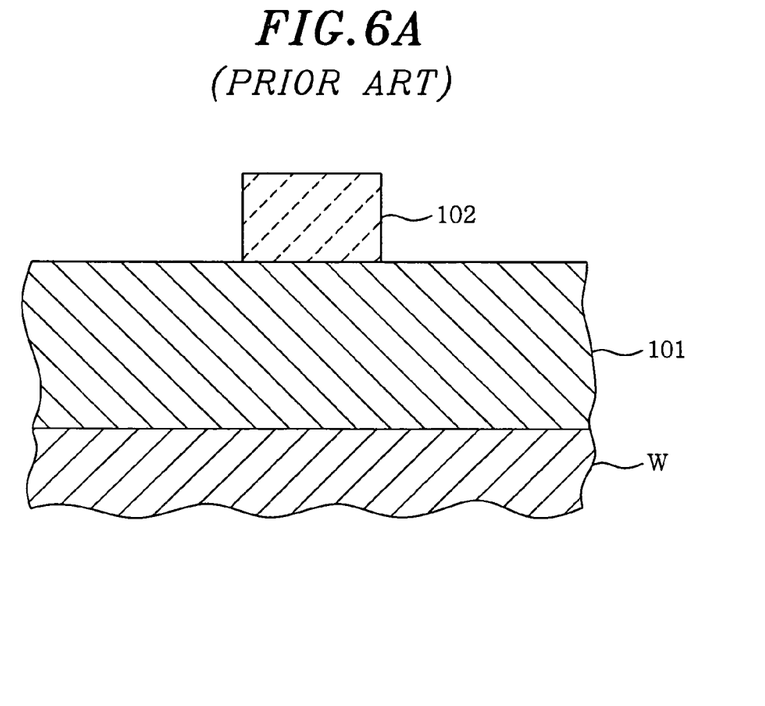
FIGS. 6A and 6B show drawings to illustrate the problem to be resolved by the present invention.

However, as a result of extensive researches conducted by the present inventors, the following issue was identified in the aforementioned etching process. Namely, as shown in FIG. 6A, when a mask material layer 102 with a desired pattern is formed on a silicon oxide film (e.g., thermal oxide film) 101 which is on a semiconductor wafer W, thereafter, as shown in FIG. 6B exposed parts of the silicon oxide film 101 are plasma-etched according to the pattern shape of the mask material layer 102 by using a gaseous mixture of $C_5F_8$ gas, $O_2$ gas and Ar gas to form grooves (trenches) 103 on the silicon oxide film 101, as shown by the dotted lines, the issue is that undesirable grooves, i.e., so-called microtrenches, are formed on the base portions of sidewalls (the angled portions of the grooves 103's bottom portions) where approximately right-angled portions should be formed.

Figure 6B:
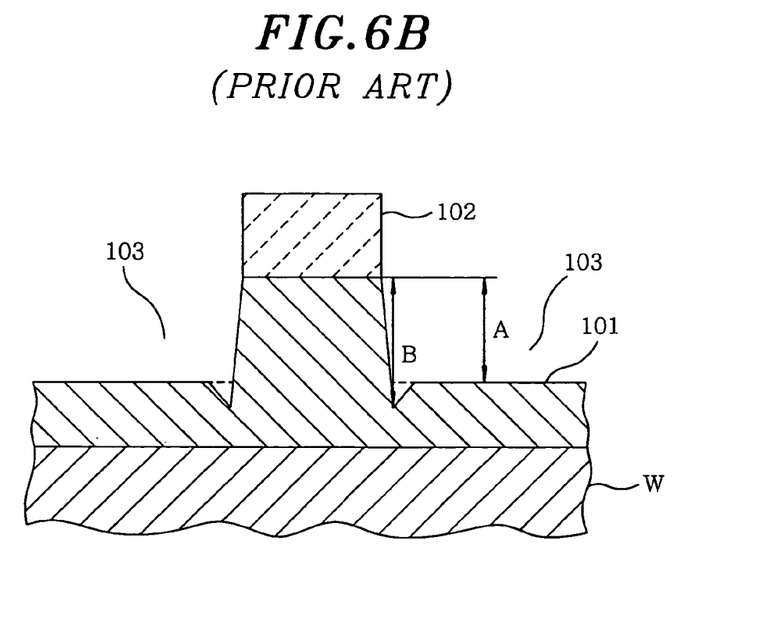

Here, in order to numerically estimate the production of such microtrenches, the etching depth of the silicon oxide film 101 of its flat portion indicated by arrow A excluding the microtrench portion and the etching depth of the silicon oxide film 101 of the microtrench portion indicated by arrow B in FIG. 6B are measured, and then their ratio (B/A) (hereinafter, referred to as a microtrench coefficient) is obtained. Further, in an assessment using a microtrench coefficient, it is preferable that the microtrench coefficient is approximately 1, but in a case such as the example shown in FIG. 6B, as will be discussed later, the value of the above-mentioned microtrench coefficient is greater than or equal to 1.14.

If microtrenches as above are formed, for example when wiring materials or other materials are buried in the grooves (trenches), it is possible to have a problem such that the materials are not sufficiently buried in the microtrench portions thereby forming a gap. Further, when being used as a machine component and the like, it is possible to have a problem such that the component's mechanical strength is undermined because of the existence of microtrenches. Therefore, the formation of microtrenches as above should be prevented as much as possible.

SUMMARY OF THE INVENTION

It is, therefore, an object of the present invention to provide an etching method and an etching apparatus capable of preventing the formation of microtrenches and highly accurate etching to obtain a desired shape.

In accordance with one aspect of the invention, there is provided an etching method for etching a silicon-containing oxide according to a pattern shape of a mask by using a gaseous mixture of gas containing carbon and fluorine, oxygen gas and inert gas, wherein recesses are formed in the silicon-containing oxide by an etching carried out under a condition that a ratio of a total flow rate of the gas containing carbon and fluorine and the oxygen gas to a flow rate of the inert gas ((a flow rate of the gas containing carbon and fluorine+a flow rate of the oxygen gas)/the flow rate of the inert gas) is smaller than or equal to 0.02, the recesses having approximately planar bottom portions formed of the silicon-containing oxide and approximately vertical sidewall portions formed of the silicon-containing oxide, and angled portions formed by the sidewall portions and the bottom portions being substantially right angled, and a formation of narrow groove shaped microtrenches is suppressed at the bottom portion sides of the angled portions.

Further, in the etching method of the present invention, the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) is smaller than or equal to 0.015.

Furthermore, in the etching method of the present invention, the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) is greater than or equal to 0.003.

Still further, in the etching method of the present invention, the inert gas is Ar.

Additionally, in the etching method of the present invention, the gas containing carbon and fluorine is $C_5F_8$.

Moreover, in the etching method of the present invention, the etching is performed by mounting an object to be processed having the silicon-containing oxide on a lower electrode of an etching apparatus in which an upper electrode and the lower electrode are disposed to face each other and then applying a high frequency power to the lower electrode.

Further, in the etching method of the present invention, the silicon-containing oxide is a silicon oxide film.

Furthermore, in the etching method of the present invention, the etching is performed while a magnetic field is formed approximately perpendicularly to a high frequency electric field formed by the high frequency power.

In accordance with another aspect of the invention, there is provided an etching method for etching a silicon-containing oxide according to a pattern shape of a mask by using a gaseous mixture of gas containing carbon and fluorine, oxygen gas and inert gas, the etching method including, a first step of performing an etching by setting a ratio of a total flow rate of the gas containing carbon and fluorine and the oxygen gas to a flow rate of the inert gas ((a flow rate of the gas containing carbon and fluorine+a flow rate of the oxygen gas)/a flow rate of the inert gas) as a first value; and a second step of performing an etching by setting the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) as a second value smaller than the first value, wherein recesses are formed in the silicon-containing oxide by an etching, the recesses having approximately planar bottom portions formed of the silicon-containing oxide and approximately vertical sidewall portions formed of the silicon-containing oxide, and angled portions formed by the sidewall portions and the bottom portions being substantially right angled, and a formation of narrow groove shaped microtrenches is suppressed at the bottom portion sides of the angled portions.

Further, in the etching method of the present invention, the first value is greater than 0.02 and the second value is smaller than or equal to 0.02.

Furthermore, in the etching method of the present invention, the inert gas is Ar.

Still further, in the etching method of the present invention, the gas containing carbon and fluorine is $C_5F_8$.

In accordance with still another aspect of the invention, there is provided an etching apparatus for etching a silicon-containing oxide according to a pattern shape of a mask by using a gaseous mixture of gas containing carbon and fluorine, oxygen gas and inert gas, wherein recesses are formed in the silicon-containing oxide by performing an etching while supplying the gaseous mixture having a ratio of a total flow rate of the gas containing carbon and fluorine and the oxygen gas to a flow rate of the inert gas ((a flow rate of the gas containing carbon and fluorine+a flow rate of the oxygen gas)/the flow rate of the inert gas) smaller than or equal to 0.02, the recesses having approximately planar bottom portions formed of the silicon-containing oxide and approximately vertical sidewall portions formed of the silicon-containing oxide, and angled portions formed by the sidewall portions and the bottom portions being substantially right angled, and a formation of narrow groove shaped microtrenches is suppressed at the bottom portion sides of the angled portions.

Further, in the etching apparatus of the present invention, the supplied gaseous mixture has the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) smaller than or equal to 0.015.

Furthermore, in the etching apparatus of the present invention, the supplied gaseous mixture has the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) greater than or equal to 0.003.

Still further, in the etching apparatus of the present invention, the inert gas is Ar.

Additionally, in the etching apparatus of the present invention, the gas containing carbon and fluorine is $C_5F_8$.

Moreover, in the etching apparatus of the present invention, the etching apparatus includes an upper electrode and a lower electrode disposed to face the upper electrode, wherein the etching is performed by mounting an object to be processed having the silicon-containing oxide on the lower electrode and then applying a high frequency power to the lower electrode.

Further, in the etching apparatus of the present invention, the silicon-containing oxide material is a silicon oxide film.

Furthermore, the etching apparatus of the present invention includes a magnetic field forming mechanism for forming a magnetic field approximately perpendicular to a high frequency electric field formed by the high frequency power.

Moreover, a microtrench coefficient represented by a ratio of an etching depth of the silicon-containing oxide of the angled portions to an etching depth of the silicon-containing oxide other than the angled portions of the recesses is 1.10 to 1.00.

DETAILED DESCRIPTION OF THE PREFERRED EMBODIMENTS

Figure 2:
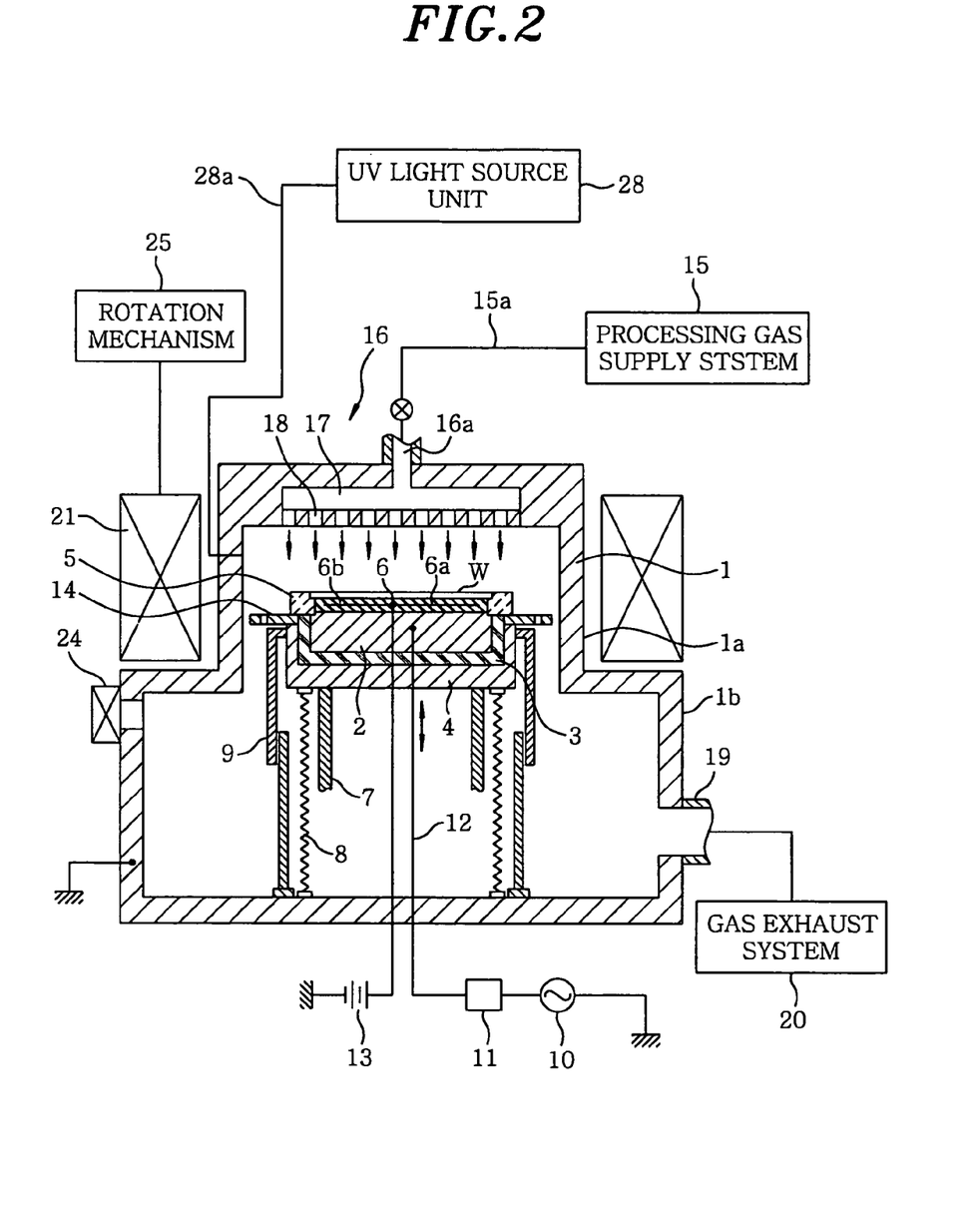
FIG. 2 shows a schematic configuration of an etching apparatus in accordance with the preferred embodiment of the present invention.

Hereinafter, a preferred embodiment of the present invention will be described in detail with reference to the accompanying drawings. FIG. 2 schematically illustrates a configuration of an etching apparatus in accordance with the preferred embodiment. Referring to FIG. 2, there is illustrated a cylindrical vacuum chamber 1 which makes up a plasma processing chamber, wherein the chamber 1 is made of, for example, aluminum while its inner space is sealed airtight.

The vacuum chamber 1 is in stepped cylindrical form and is composed of an upper part 1a with a small diameter and a lower part 1b with a large diameter; the chamber is connected to a ground potential. Further, installed inside the vacuum chamber 1 is a supporting table (susceptor) 2 to support a semiconductor wafer W as a substrate to be processed. The table supports the wafer W in such a manner that it lies in an approximately horizontal position while its surface to be processed faces upward.

The supporting table 2 is made of, for example, aluminum, and is held up by a conductive support 4 via an insulating plate 3 made of ceramic and the like. Further, around the upper peripheral portion of the supporting table 2, a focus ring 5 formed of conductive or insulating material is disposed.

In addition, on the mounting surface of the supporting table 2 for the semiconductor wafer W, an electrostatic chuck 6 is disposed to electrostatically attract and hold the semiconductor wafer W. The electrostatic chuck 6 is formed of an insulator 6b having an electrode 6a embedded therein, which is connected to a DC power supply 13. Then, by applying a voltage from the power supply 13 to the electrode 6a, the semiconductor wafer W is attracted and held on the chuck because of, for example, a Coulomb force.

Moreover, installed within the supporting table 2 are a coolant channel (not shown) to circulate a coolant and a gas introduction mechanism (not shown) for supplying He gas to the bottom surface of the semiconductor wafer W to efficiently transfer cold heat from the coolant to the semiconductor wafer W. Hence, it is possible to control the semiconductor wafer W to a desired temperature. In addition, it is configured such that the pressure of He gas can be independently controlled for the center portion and the edge portion of the semiconductor wafer W. Further, with respect to the parts that make up the inside processing space of the vacuum chamber 1, it is designed so that the respective temperatures of their top, wall and bottom can be independently controlled.

The supporting table 2 and the support 4 are elevated by a ball screw mechanism, which includes ball screws 7. The driving portion under the support 4 is covered with a bellows 8 made of stainless steel (SUS), and outside the bellows 8, a bellows cover 9 is installed.

Further, a feeder line 12 for supplying a high frequency power is connected to approximately the center of the supporting table 2. A matching box 11 and a high frequency power supply 10 are connected to the feeder line 12. A high frequency power ranging from 13.56 to 150 MHz (in this embodiment, a high frequency power of 13.56 MHz) is supplied from the high frequency power supply 10 to the supporting table 2.

Further, a gas exhaust ring 14 is installed outside the focus ring 5. The gas exhaust ring 14 is electrically connected to the vacuum chamber 1 through the support 4 and the bellows 8.

Meanwhile, at the ceiling portion of the vacuum chamber 1 above the supporting table 2, a shower head 16 is installed so that it faces in parallel the supporting table 2 and the shower head 16 is grounded. Thus, it is designed so that the supporting table 2 and the shower head 16 function as a pair of electrodes.

A plurality of gas discharge openings 18 are formed at the bottom surface of the shower head 16, and a gas inlet 16a is disposed at an upper portion thereof. Also, a gas diffusion space 17 is formed on the inside thereof. The gas inlet 16a is connected to a gas supply line 15a, and at the other end of the gas supply line 15a, a processing gas supply system 15 is connected in order to supply a processing gas for etching.

The processing gas for etching, which is supplied from the processing gas supply system 15, is a gaseous mixture, which contains gas of carbon and fluorine, oxygen gas and inert gas, while in this embodiment, it is a gaseous mixture which consists of $C_5F_8$ gas, $O_2$ gas and Ar gas. The processing gas is supplied from the processing gas supply system 15 to the gas diffusion space 17 of the shower head 16, through the gas supply line 15a and the gas inlet 16a; then discharged through the gas discharge openings 18, ultimately being supplied for etching a film formed on the semiconductor wafer W.

Further, a gas exhaust port 19 is formed in the sidewall of the lower part 1b of the vacuum chamber 1, and the gas exhaust port 19 is connected to a gas exhaust system 20. In addition, by operating a vacuum pump installed in the gas exhaust system 20, the inner space of the vacuum chamber 1 can be decompressed to a certain vacuum level. Also, installed in the upper sidewall of the lower part 1b of the vacuum chamber 1 is a gate valve 24 to open and close a loading/unloading port for the semiconductor wafer W.

In the meantime, around the peripheral portion of the upper part 1a of the vacuum chamber 1, concentrically with the vacuum chamber 1, a ring-shaped magnetic field forming mechanism (ring magnet) 21 is disposed, so that a magnetic field can be formed in a processing space between the supporting table 2 and the shower head 16. The entire magnetic field forming mechanism 21 can rotate around the vacuum chamber 1 at a certain rotation speed by a rotation mechanism 25.

Also, as for the magnetic forming mechanism 21, it is possible to use the type for forming a dipole magnetic field or one for forming a multi-pole magnetic field while in this embodiment, the magnetic field forming mechanism 21 for forming a dipole magnetic field approximately perpendicular to a high frequency electric field is used.

Further, an optical fiber 28a is connected to a sidewall of a portion corresponding to the processing space of the vacuum chamber 1, so that certain ultraviolet (UV) rays can be emitted from a UV light source unit 28 to the processing space of the vacuum chamber 1 through the optical fiber 28a. UV rays are emitted to the processing space because it is difficult to ignite a plasma only by applying a high frequency, depending on the resistance state in the vacuum chamber 1 (especially the electrode to which a high frequency is applied). Namely, by emitting UV rays and applying a high frequency simultaneously, the processing gas can be excited and ionized, thereby facilitating the plasma ignition.

Further, the shorter the wavelength of UV rays, the more preferable it is, and for example, smaller than or equal to 300 nm can be used. It is preferable to emit the rays for, for example, 0.5 to 5 seconds. In addition, since the UV rays are introduced into the vacuum chamber 1 via the optical fiber 28a in this embodiment, ultraviolet rays with a short wavelength smaller than or equal to 200 nm can be emitted without energy loss in the rays' introduction path. In case of a long wavelength, a window is provided in the vacuum chamber 1 and then UV rays are emitted from the outside of the window into the vacuum chamber 1, thereby introducing ultraviolet rays into the vacuum chamber 1.

Using an etching apparatus configured as described above, in this embodiment, as illustrated in FIG. 1A, the semiconductor wafer W with the mask material layer 102 having a desired pattern on the silicon oxide film (a thermal oxide film) 101 is used, and exposed parts of the silicon oxide film 101 are etched according to the pattern shape of the mask material layer 102, thereby forming the grooves (trenches) 103. The grooves (trenches) 103's width is about 5.75 µm.

The order of the etching is as follows: first, the gate valve 24 is opened, and the semiconductor wafer W is loaded into the vacuum chamber 1 by a transfer mechanism (not shown) via a load-lock chamber (not shown) disposed adjacent to the gate valve 24. Thereafter, the semiconductor wafer W is mounted on the supporting table 2, which has been already lowered to a certain level. Then, by applying a certain voltage from the DC power supply 13 to the electrode 6a of the electrostatic chuck 6, the semiconductor wafer W is attracted and held by the Coulomb force.

Subsequently, after the transfer mechanism is withdrawn out of the vacuum chamber 1, the gate valve 24 is closed. Then, the supporting table 2 is elevated to the level shown in FIG. 1 and, at the same time, the inside of the vacuum chamber 1 is exhausted through the gas exhaust port 19 by using the vacuum pump in the gas exhaust system 20.

After a certain vacuum level is achieved inside the vacuum chamber 1, a processing gas, which is a gaseous mixture of $C_5F_8$ gas, $O_2$ gas and Ar gas, is introduced at a certain flow rate from the processing gas supply system 15 into the vacuum chamber 1. The inside of the vacuum chamber 1 is maintained at a certain pressure level such as at 1.33 to 133 Pa (10 to 1000 mTorr); the pressure level is maintained at 13.3 Pa (100 mTorr) or 5.32 Pa (40 mTorr) in this embodiment.

Further, in such a state, a high frequency power with a certain frequency, for example 13.56 MHz in this embodiment, is supplied from the high frequency power supply 10 to the supporting table 2 and, at the same time, UV rays are emitted from the aforementioned UV light source unit 28 upon ignition of the plasma.

In this case, as a result of applying the high frequency power to the supporting table 2 serving as a lower electrode, a high frequency electric field is formed in the processing space between the shower head 16 serving as the upper electrode and the supporting table 2 as the lower electrode and, at the same time, a magnetic field is formed by the magnetic field forming mechanism 21. In that state, plasma etching of the silicon oxide film 101 is performed.

Further, once a certain etching process is carried out, supplying of the high frequency power from the high frequency power supply 10 is stopped to terminate the etching process, and the semiconductor wafer W is carried out of the vacuum chamber 1 in reverse order of the aforementioned sequence.

Here, more detailed etching conditions in the aforementioned etching are described as follows:

$C_5F_8/O_2/Ar=6/4/1000$ sccm
$((C_5F_8+O_2)/Ar=0.01$ (1%))
Pressure=13.3 Pa (100 mTorr)
High frequency output=1500 W
Gap between electrodes=27 mm
Backside He pressure (center/edge)=5320/26600 Pa (4/20 Torr)
Temperature (top/wall/bottom)=60/60/30° C.

Figure 1A:
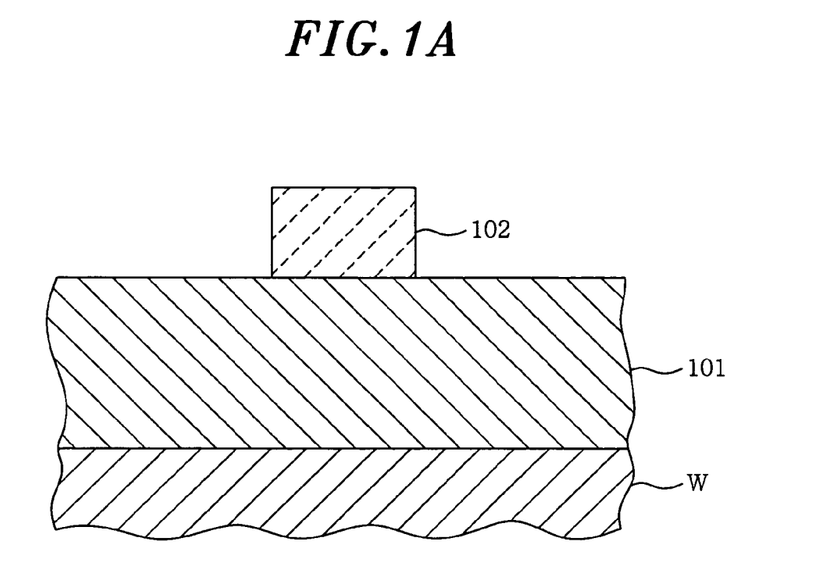
FIGS. 1A and 1B are drawings that illustrate a preferred embodiment of the present invention's etching method.
Figure 1B:
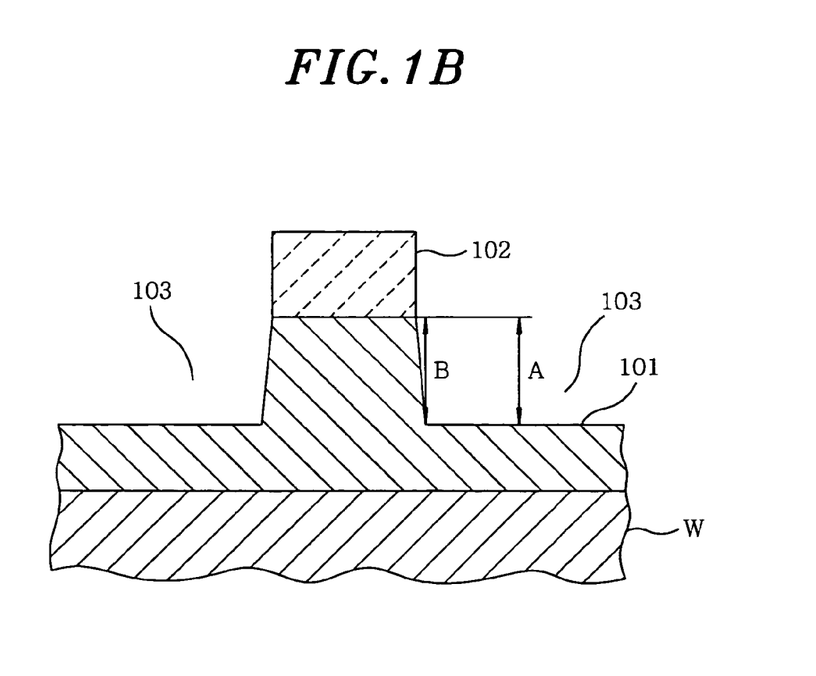

Consequently, as illustrated in FIG. 1B, microtrenches are hardly formed, and thus, it is possible to obtain approximately right-angled base portions of the sidewalls. The microtrench coefficient (B/A) is about 1.03 (A=4.84 μm, B=5.00 μm).

Figure 3:
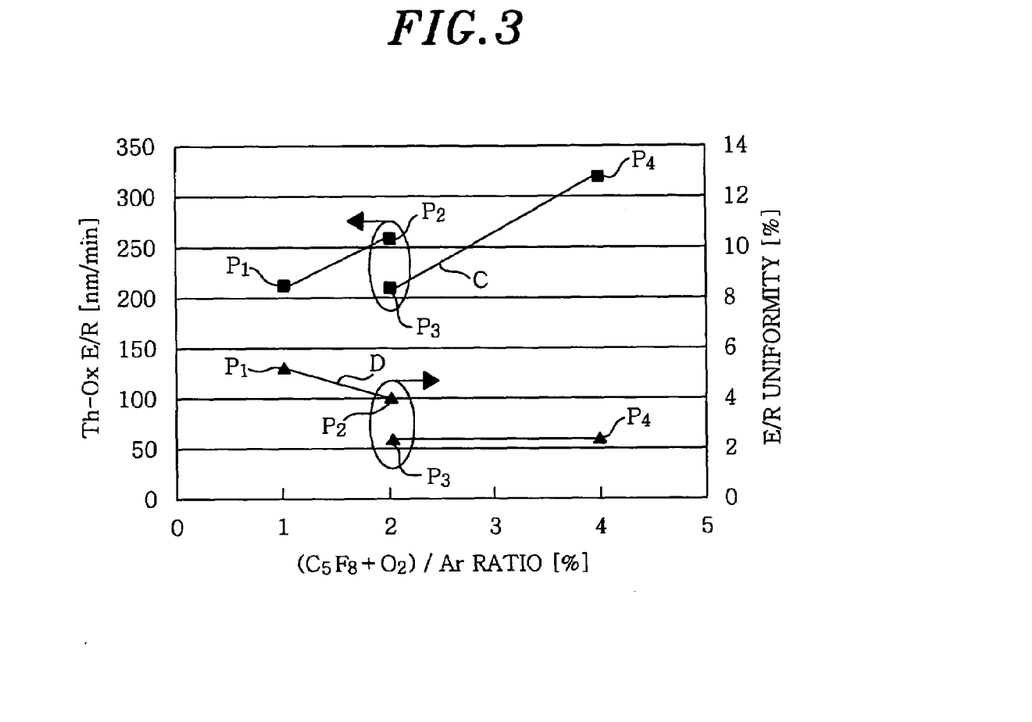
FIG. 3 are charts that illustrate the relations between $(C_5F_8+O_2)/Ar$ and etching rate, and between $(C_5F_8+O_2)/Ar$ and etching rate uniformity.
Figure 4:
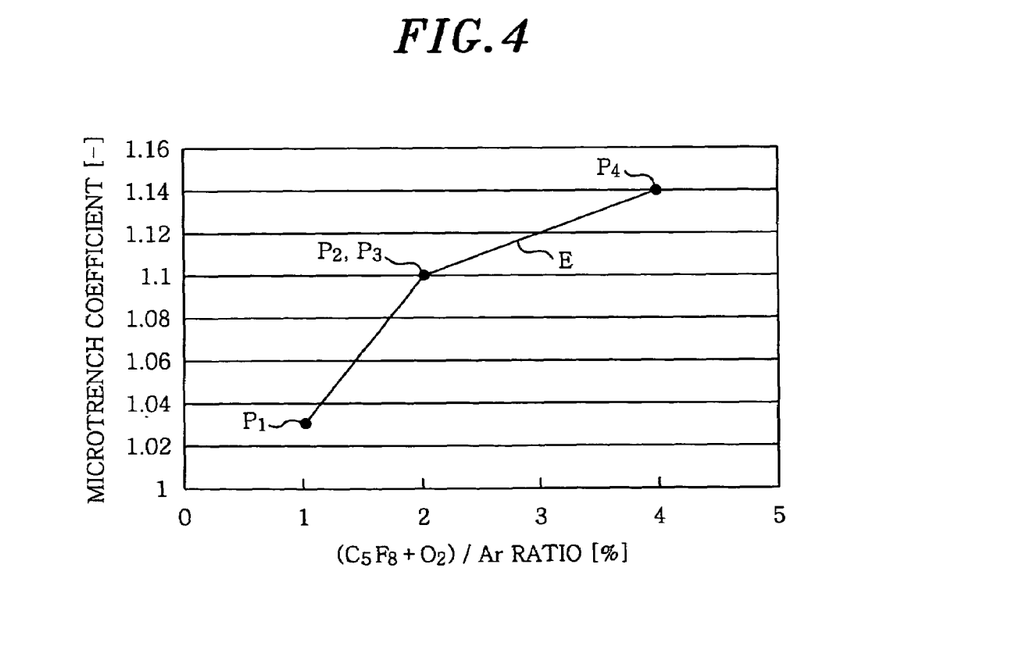
FIG. 4 is a chart that illustrates the relation between $(C_5F_8+O_2)/Ar$ and a microtrench coefficient.

FIGS. 3 and 4 illustrate, with regard to the aforementioned etching of the silicon oxide film 101, changes in the etching rate (solid line C in FIG. 3), in the etching rate uniformity (in-surface uniformity) (a solid line D in FIG. 3) and in the microtrench coefficient (a solid line E in FIG. 4) when the ratio of the total flow rate of $C_5F_8+O_2$ to the flow rate of Ar $((C_5F_8+O_2)/Ar)$ is varied.

Further, in FIG. 3, the solid lines C and D are respectively broken into P1 to P2 and P3 to P4 in the middle because the pressures are set differently at 13.3 Pa (100 mTorr) for the left solid line P1 to P2 and at 5.32 Pa (40 mTorr) for the right solid line P3 to P4 on the chart.

Further, specific flow rates of each gas in P1 as mentioned above are $C_5F_8/O_2/Ar=6/4/1000$ sccm
$((C_5F_8+O_2)/Ar=0.01$ (1%))
while P2 and P3 have the same flow rates as,
$C_5F_8/O_2/Ar=6/4/500$ sccm
$((C_5F_8+O_2)/Ar=0.02$ (2%)),
and P4 has,
$C_5F_8/O_2/Ar=12/9/19500$ sccm
$((C_5F_8+O_2)/Ar=0.04$ (4%)).

Further, while with regard to P1, the microtrench coefficient (B/A) and specific values of A and B are the same as the aforementioned values, the microtrench coefficient (B/A) of P2, P3 and P4 are about 1.10 (A=5.43 μm, B=5.99 μm), 1.10 (A=5.87 μm, B=6.46 μm) and 1.15 (A=7.30 μm, B=8.37 μm), respectively.

As indicated by solid line E in FIG. 4, the microtrench coefficient tends to become more preferable as the ratio of the total flow rate of $C_5F_8+O_2$ to the flow rate of Ar $((C_5F_8+O_2)/Ar)$ becomes smaller. It is recommended that the microtrench coefficient ranges between 1.10 and 1.00. Accordingly, the ratio of the total flow rate of $C_5F_8+O_2$ to the flow rate of Ar $((C_5F_8+O_2)/Ar)$ is preferably smaller than or equal to 0.02 (2%) and, more preferably, smaller than or equal to 0.015 (1.5%).

On one hand, as illustrated by solid line C in FIG. 3, the etching rate tends to decrease as the ratio of the total flow rate of $C_5F_8+O_2$ to the flow rate of Ar $((C_5F_8+O_2)/Ar)$ gets smaller. Further, as displayed by solid line D in FIG. 3, the etching rate uniformity (in-surface uniformity) also tends to deteriorate as the ratio becomes smaller. Therefore, the ratio of the total flow rate of $C_5F_8+O_2$ to the flow rate of Ar $((C_5F_8+O_2)/Ar)$ is preferably greater than or equal to about 0.003 (0.3%).

Further, by changing the ratio of the total flow rate of $C_5F_8+O_2$ to the flow rate of Ar $((C_5F_8+O_2)/Ar)$ during an etching process, it is possible to perform the etching process with multiple stages.

Namely, for example, in the initial stage of an etching process, in order to increase its etching rate and to maintain a high in-surface uniformity of the etching rate, the ratio of the total flow rate of $C_5F_8+O_2$ to the flow rate of Ar $((C_5F_8+O_2)/Ar)$ is set to a large value (e.g., greater than 0.02 (2%)).

Then, in the second stage of the etching process, to prevent the formation of microtrenches, the ratio of the total flow rate of $C_5F_8+O_2$ to the flow rate of Ar $((C_5F_8+O_2)/Ar)$ is set to a small value (e.g., smaller than or equal to 0.02 (2%)).

As described above, by changing the ratio of the total flow rate of $C_5F_8+O_2$ to the flow rate of Ar $((C_5F_8+O_2)/Ar)$ during an etching process so that an etching process of multiple stages (e.g., two stages) is performed and consequently, it is possible to prevent the formation of microtrenches while increasing the etching rate and maintaining a high in-surface uniformity of the etching rate.

Further, a mechanism of suppressing the formation of microtrenches by selecting the gaseous mixture as described above is presumed to be as follows. Namely, one of the causes for the formation of microtrenches may be due to a difference between the etching rate of the portion indicated by arrow A (flat portion of the grooves 103) and that of the portion indicated by arrow B (microtrench portion). The difference is attributed to an accumulation of a large amount of etching deposits that slow down the etching rate in the flat portion. Further, as described above, when the ratio of the total flow rate of $C_5F_8+O_2$ to the flow rate of Ar $((C_5F_8+O_2)/Ar)$ is lowered and the amount of Ar in the gaseous mixture is increased, the above-mentioned deposits get removed by a sputtering by Ar while the above-mentioned difference between the etching rates is reduced, thereby suppressing the formation of microtrenches.

Figure 5:
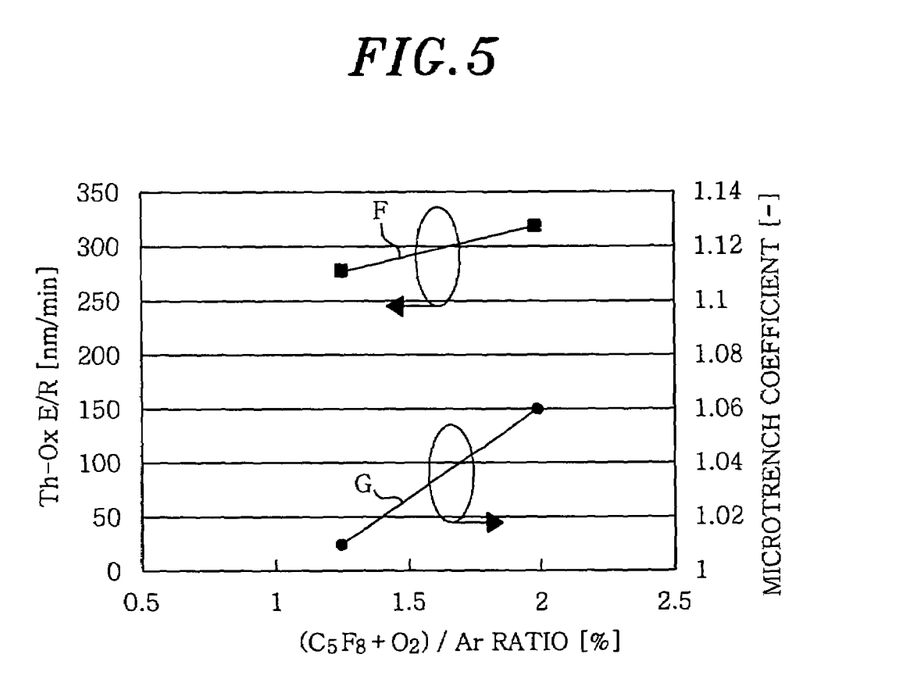
FIG. 5 provides the relations between $(C_5F_8+O_2)/Ar$ and microtrench coefficient when the width of a trench is narrow.

FIG. 5, unlike the case shown in FIGS. 1A and 1B, with respect to etching patterns with grooves (trenches) having a narrow width (e.g., about 0.6 μm), illustrates the relations between the ratio of the total flow rate of $C_5F_8+O_2$ to the flow rate of Ar $((C_5F_8+O_2)/Ar)$ and the etching rate (solid line F) and between the ratio $((C_5F_8+O_2)/Ar)$ and the microtrench coefficient (solid line G).

Further, etching conditions with respect to flow rates are described as follows, respectively:

$C_5F_8/O_2/Ar=6/4/500$ sccm
$((C_5F_8+O_2)/Ar=0.02$ (2%)) and $C_5F_8/O_2/Ar=6/4/800$ sccm $((C_5F_8+O_2)/Ar=0.0125$ (1.25%)).

Other conditions are described as follows:

Pressure=15.96 Pa (120 mTorr)

High frequency output=1400 W

Gap between electrodes=27 mm

Backside helium pressure (center/edge)=931/5320 Pa (7/40 Torr)

Temperature (top/wall/bottom)=60/60/20° C.

As illustrated in FIG. 5, even in a case where the width of grooves (trenches) is narrow, the ratio of the total flow rate of $C_5F_8+O_2$ to the flow rate of Ar $((C_5F_8+O_2)/Ar)$ is set smaller than or equal to 0.02 (2%), so that the microtrench coefficient can have a preferred value smaller than or equal to 1.1.

Further, although the above embodiment describes a case where $C_5F_8$ is used as the gas containing carbon and fluorine, other gas species such as $C_4F_6$, $C_3F_8$, and $C_4F_8$ can be used instead as a gas with carbon and fluorine.

Further, although this embodiment describes a case where Ar is used as the inert gas, other inert gas species such as Xe and Kr can also be used.

Further, this embodiment describes a case where a thermal oxide film formed on the semiconductor wafer W is etched as the silicon oxide to be etched, but the silicon oxide is not limited to the thermal oxide film and can be CVD film, SOG film, quartz or the like, which may also contain impurities such as phosphorus and boron. Still further, it is not limited to the silicon oxide on the semiconductor wafer W and can be applied to every silicon oxide.

In addition, besides the silicon oxide film, this invention can be applied to silicon-containing oxides known as inorganic low-K film such as SiOC, SiON and SiOF.

Further, while an organic material such as resist is used as the mask material, it may not function properly as a mask since the mask material gets etched when the amount of etching is large. In such a case, an inorganic material film such as nitride film with a high etching resistance, e.g., a silicon nitride film, can be used. Further, although the etching apparatus used for etching is an apparatus in which a high frequency voltage is applied to both an upper electrode and an lower electrode, it is possible to use other apparatuses such as ECR plasma etching apparatus, helicon wave plasma etching apparatus, TCP plasma etching apparatus, inductively coupled plasma etching apparatus and the like.

As described above, in accordance with the present invention, the formation of microtrenches can be suppressed so that highly accurate etching of a desired shape can be performed.

While the invention has been shown and described with respect to the preferred embodiments, it will be understood by those skilled in the art that various changes and modifications may be made without departing from the spirit and scope of the invention as defined in the following claims.

INDUSTRIAL APPLICABILITY

An etching method and an etching apparatus in accordance with the present invention can be used in a semiconductor manufacturing industry for manufacturing semiconductor devices and, therefore, have an industrial applicability.

What is claimed is:

1. An etching method for etching a silicon-containing oxide according to a pattern shape of a mask by using a gaseous mixture of gas containing carbon and fluorine, oxygen gas and inert gas,
   wherein recesses are formed in the silicon-containing oxide by an etching carried out under a condition that a ratio of a total flow rate of the gas containing carbon and fluorine and the oxygen gas to a flow rate of the inert gas ((a flow rate of the gas containing carbon and fluorine+a flow rate of the oxygen gas)/a flow rate of the inert gas) is smaller than 0.015, the recesses having approximately planar bottom portions formed of the silicon-containing oxide and approximately vertical sidewall portions formed of the silicon-containing oxide, and angled portions formed by the sidewall portions and the bottom portions being substantially right angled, and
   a formation of narrow groove shaped microtrenches is suppressed at the bottom portion sides of the angled portions.

2. The etching method of claim 1, wherein the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) is greater than or equal to 0.003.

3. The etching method of claim 1, wherein a microtrench coefficient represented by a ratio of an etching depth of the silicon-containing oxide of the angled portions to an etching depth of the silicon-containing oxide other than the angled portions of the recesses is 1.10 to 1.00.

4. The etching method of claim 1, wherein the inert gas is Ar.

5. The etching method of claim 4, wherein the gas containing carbon and fluorine is $C_5F_8$.

6. The etching method of claim 1, wherein the etching is performed by mounting an object to be processed having the silicon-containing oxide on a lower electrode of an etching apparatus in which an upper electrode and the lower electrode are disposed to face each other and then applying a high frequency power to the lower electrode.

7. The etching method of claim 6, wherein the silicon-containing oxide is a silicon oxide film.

8. The etching method of claim 6, wherein the etching is performed while a magnetic field is formed approximately perpendicular to a high frequency electric field formed by the high frequency power.

9. An etching method for etching a silicon-containing oxide according to a pattern shape of a mask by using a gaseous mixture of gas containing carbon and fluorine, oxygen gas and inert gas, the etching method comprising:
   a first step of etching the silicon-containing oxide by setting a ratio of a total flow rate of the gas containing carbon and fluorine and the oxygen gas to a flow rate of the inert gas ((a flow rate of the gas containing carbon and fluorine+a flow rate of the oxygen gas)/a flow rate of the inert gas) as a first value; and
   a second step of etching the silicon-containing oxide by setting the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) as a second value smaller than the first value,
   wherein recesses are formed in the silicon-containing oxide by the first and the second steps of etching, the recesses having approximately planar bottom portions formed of the silicon-containing oxide and approximately vertical sidewall portions formed of the silicon-containing oxide, and angled portions formed by the sidewall portions and the bottom portions being substantially right angled, and a formation of narrow groove shaped microtrenches is suppressed at the bottom portion sides of the angled portions.

10. The etching method of claim 9, wherein the inert gas is Ar.

11. The etching method of claim 9, wherein the gas containing carbon and fluorine is $C_5F_8$.

12. An etching method for etching a silicon-containing oxide according to a pattern shape of a mask by using a gaseous mixture of gas containing carbon and fluorine, oxygen gas and inert gas, the etching method comprising:

a first step of etching the silicon-containing oxide by setting a ratio of a total flow rate of the gas containing carbon and fluorine and the oxygen gas to a flow rate of the inert gas ((a flow rate of the gas containing carbon and fluorine+a flow rate of the oxygen gas)/a flow rate of the inert gas) as a first value; and a second step of etching the silicon-containing oxide by setting the ratio of the total flow rate of the gas containing carbon and fluorine and the oxygen gas to the flow rate of the inert gas ((the flow rate of the gas containing carbon and fluorine+the flow rate of the oxygen gas)/the flow rate of the inert gas) as a second value smaller than the first value, wherein recesses are formed in the silicon-containing oxide by the first and the second steps of etching, the recesses having approximately planar bottom portions formed of the silicon-containing oxide and approximately vertical sidewall portions formed of the silicon-containing oxide, and angled portions formed by the sidewall portions and the bottom portions being substantially right angled, and a formation of narrow groove shaped microtrenches is suppressed at the bottom portion sides of the angled portions, and wherein the first value is greater than 0.02 and the second value is smaller than or equal to 0.02.

13. The etching method of claim 12, wherein a microtrench coefficient represented by a ratio of an etching depth of the silicon-containing oxide of the angled portions to an etching depth of the silicon-containing oxide other than the angled portions of the recesses is 1.10 to 1.00.

14. The etching method of claim 12, wherein the inert gas is Ar.

15. The etching method of claim 12, wherein the gas containing carbon and fluorine is $C_5F_8$.

* * * * *